United States Patent
Harshfield

(10) Patent No.: US 6,420,725 B1
(45) Date of Patent: Jul. 16, 2002

(54) METHOD AND APPARATUS FOR FORMING AN INTEGRATED CIRCUIT ELECTRODE HAVING A REDUCED CONTACT AREA

(75) Inventor: Steven T. Harshfield, Emmett, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 08/486,635

(22) Filed: Jun. 7, 1995

(51) Int. Cl.⁷ .................. H01L 47/00; H01L 31/117; H01L 23/52

(52) U.S. Cl. ................ 257/4; 257/614; 257/616; 257/774

(58) Field of Search ............... 257/1, 4, 5, 2, 257/613, 614, 616, 774, 3; 365/148, 163, 164

(56) References Cited

U.S. PATENT DOCUMENTS

| | | | |
|---|---|---|---|
| 3,423,646 A | 1/1969 | Cubert et al. ............... 317/234 |
| 3,796,926 A | 3/1974 | Cole et al. ............... 317/234 R |
| 3,877,049 A | * 4/1975 | Buckley ........................... 257/4 |
| 4,099,260 A | 7/1978 | Lynes et al. ................. 365/105 |
| 4,115,872 A | 9/1978 | Bluhm ......................... 365/163 |
| 4,174,521 A | 11/1979 | Neale ........................... 357/45 |
| 4,194,283 A | 3/1980 | Hoffmann ..................... 29/571 |
| 4,203,123 A | 5/1980 | Shanks ............................ 357/2 |
| 4,227,297 A | 10/1980 | Angerstein ................... 29/571 |
| 4,272,562 A | 6/1981 | Wood .......................... 427/87 |
| 4,458,260 A | 7/1984 | McIntyre et al. ............... 357/30 |
| 4,502,208 A | 3/1985 | McPherson ................... 29/584 |
| 4,569,698 A | 2/1986 | Feist ........................... 148/1.5 |
| 4,641,420 A | * 2/1987 | Lee ............................ 257/774 |
| 4,757,359 A | 7/1988 | Chiao et al. ................ 357/23.5 |
| 4,804,490 A | 2/1989 | Pryor et al. .......... 252/62.3 BT |
| 4,809,044 A | 2/1989 | Pryor et al. ..................... 357/2 |
| 4,823,181 A | 4/1989 | Mohsen et al. ................ 357/51 |
| 4,876,220 A | 10/1989 | Mohsen et al. ............. 437/170 |
| 4,876,668 A | 10/1989 | Thakoor et al. ............. 365/163 |
| 4,881,114 A | 11/1989 | Mohsen et al. ................ 357/54 |
| 4,892,840 A | 1/1990 | Esquivel et al. ............... 437/52 |
| 5,144,404 A | 9/1992 | Iranmanesh et al. .......... 357/51 |
| 5,166,096 A | 11/1992 | Cote et al. ................... 437/195 |
| 5,166,758 A | 11/1992 | Ovshinsky et al. ............. 257/3 |
| 5,177,567 A | * 1/1993 | Klersy et al. ................... 257/4 |
| 5,296,716 A | 3/1994 | Ovshinsky et al. ............. 257/3 |
| 5,335,219 A | * 8/1994 | Ovshinsky et al. ......... 369/288 |

(List continued on next page.)

FOREIGN PATENT DOCUMENTS

| | | | |
|---|---|---|---|
| EP | 0 117 045 | 8/1984 | ........... H01L/45/00 |
| GB | 1 319 388 | 6/1973 | ............ H01L/9/00 |
| JP | 60109266 | 6/1985 | ........... H01L/27/10 |

OTHER PUBLICATIONS

Kim and Kim, "Effects of High–Current Pulses on Polycrystalline Silicon Diode with n–type Region Heavily Doped with Both Boron and Phosphorus," *J. Appl. Phys.*, 53(7):5359–5360, 1982.

(List continued on next page.)

*Primary Examiner*—Olik Chaudhuri
*Assistant Examiner*—Nathan Ha
(74) *Attorney, Agent, or Firm*—Fletcher, Yoder & Van Someren

(57) ABSTRACT

A method and an apparatus for manufacturing a memory cell having a non-volatile resistive memory element with a limited size active area. The method comprises a first step of providing a dielectric volume and forming a plug opening within the dielectric volume. A recessed plug of a conductive material is then formed within a lower portion of the opening and a dielectric spacer is formed along the sidewalls of an upper portion of the opening. The spacer is cylindrical and has a central hole. A contact plug is subsequently formed within the central hole, the contact plug electrically coupled to the recessed plug. The contact plug can include a memory element or an additional memory element can be applied over the contact plug.

2 Claims, 4 Drawing Sheets

U.S. PATENT DOCUMENTS

| | | | |
|---|---|---|---|
| 5,341,328 A | | 8/1994 | Ovshinsky et al. .......... 365/163 |
| 5,359,205 A | | 10/1994 | Ovshinsky ...................... 257/3 |
| 5,414,271 A | * | 5/1995 | Ovshinski et al. .............. 257/3 |
| 5,510,629 A | | 4/1996 | Karpovich et al. ............ 257/50 |
| 5,536,947 A | * | 7/1996 | Klersy et al. ................... 257/3 |

OTHER PUBLICATIONS

Neale and Aseltine, "The Application of Amorphous Materials to Computer Memories," *IEEE*, 20(2):195–205, 1973.

Pein and Plummer, "Performance of the 3–D Sidewall Flash EPROM Cell," *IEEE*, 11–14, 1993.

Post and Ashburn, "Investigation of Boron Diffusion in Polysilicon and its Application to the Design of p–n–p Polysilicon Emitter Bipolar Transistors with Shallow Emitter Junctions," *IEEE*, 38(11):2442–2451, 1991.

Post et al., "Polysilicon Emitters for Bipolar Transistors: A Review and Re–Evaluation of Theory and Experiment," *IEEE*, 39(7):1717–1731, 1992.

Post and Ashburn, "The Use of an Interface Anneal to Control the Base Current and Emitter Resistance of p–n–p Polysilicon Emitter Bipolar Transistors," *IEEE*, 13(8):408–410, 1992.

Rose et al., "Amorphous Silicon Analogue Memory Devices," *J. Non–Crystalline Solids*, 115:168–170, 1989.

Schaber et al., "Laser Annealing Study of the Grain Size Effect in Polycrystalline Silicon Schottky Diodes," *J. Appl. Phys.*, 53(12):8827–8834, 1982.

Yamamoto et al., "The I–V Characteristics of Polycrystalline Silicon Diodes and the Energy Distribution of Traps in Grain Boundaries," *Electronics and Communications in Japan*, Part 2, 75(7):51–58, 1992.

Yeh et al., "Investigation of Thermal Coefficient for Polycrystalline Silicon Thermal Sensor Diode," *Jpn. J. Appl. Phys.*, 31(Part 1, No. 2A):151–155, 1992.

Oakley et al., "Pillars—The Way to Two Micron Pitch Multilevel Metallisation," *IEEE*, 23–29, 1984.

* cited by examiner

METHOD AND APPARATUS FOR FORMING AN INTEGRATED CIRCUIT ELECTRODE HAVING A REDUCED CONTACT AREA

BACKGROUND OF THE INVENTION

The present invention relates generally to the use of electrodes in semiconductor devices, and more particularly relates to the formation of small electrodes having reduced contact areas which may be utilized, for example, in semiconductor memory devices. More specifically, the present invention relates to the manufacture of a small-sized electrode such as is useful to control the size of the active area of a chalcogenide resistive element in a memory cell of a chalcogenide memory device.

Electrodes are used in a variety of integrated circuit devices. In certain devices, such as memory devices, the ability to efficiently manufacture small electrodes is crucial in maximizing the performance and cost-efficiency of the device. A memory device can have a plurality of memory arrays, and each memory array can include hundreds of thousands of memory cells. Each memory cell generally includes a memory element and an access device (such as, for example, a diode) coupled to the memory element. Memory-storage materials, that is, materials that can be made to store information, such as by storing a charge or by changing resistivity, are used to fabricate the memory elements. Electrodes couple each memory element to a corresponding access device. The electrodes can be part of the access device and can also define the memory element.

In certain memory devices, such as memory devices having chalcogenide memory elements, the size of the electrode has a direct relationship to the speed, power requirements, and capacity of the memory device. Chalcogenides are materials which may be electrically stimulated to change states, from an amorphous state to a crystalline state, for example, or to exhibit different resistivities while in the crystalline state. Thus, chalcogenide memory elements can be utilized in memory devices for the storage of binary data, or of data represented in higher-based systems. Such memory cells will typically include a cell accessible, for example, by a potential applied to access lines, in a manner conventionally utilized in memory devices. Typically, the cell will include the chalcogenide element as a resistive element, and will include an access or isolation device coupled to the chalcogenide element. In one exemplary implementation suitable for use in a RAM, the access device may be a diode.

Many chalcogenide alloys may be contemplated for use with the present invention. For example, alloys of tellurium, antimony and germanium may be particularly desirable, and alloys having from approximately to 55–85 percent tellurium and on the order of 15–25 percent germanium are contemplated for use in accordance with the present invention. Preferably, the chalcogenide element will be generally homogeneous (although gradiented alloys may be utilized), and will be alloys formed from tellurium, selenium, germanium, antimony, bismuth, lead, strontium, arsenic, sulfur, silicon, phosphorus, oxygen and mixtures or alloys of such elements. The alloys will be selected so as to establish a material capable of assuming multiple, generally stable, states in response to a stimulus. It is contemplated that in most cases, the stimulus will represent an electrical signal, and that the multiple states will be states of differing electrical resistance. U.S. Pat. No. 5,335,219 is believed to be generally illustrative of the existing state of the art relative to chalcogenide materials, and is believed to provide explanations regarding the current theory of function and operation of chalcogenide elements and their use in memory cells. The specification of U.S. Pat. No. 5,335,219 to Ovshinski et al., issued Aug. 2, 1994, is incorporated herein by reference, for all purposes. An exemplary specific chalcogenide alloy suitable for use in the present invention is one consisting of $Te_{56}Ge_2Sb_{22}$.

An observed property of a chalcogenide element in a memory cell is that the chalcogenide element will have an "active area" which may be less than the area of the entire chalcogenide element. The size of this active area can be controlled by controlling the size of the electrode contact with the chalcogenide element. A primary reason for limiting the active area of the chalcogenide element is that the size of the active area is directly related to the programming current and/or time required to achieve the desired state change. Thus, in the interest of optimally fast programming rates of a memory device, it is desirable to minimize the dimension of electrode contacting the chalcogenide element, to minimize the active area and to thereby facilitate optimally fast programming time and optimally low programming current.

Techniques for forming the electrode of a chalcogenide memory cell include forming a hole in a dielectric layer, and then depositing a conductive material in the hole. Conventional techniques of forming the hole and the insulative layer have included the application of a high current pulse to open a hole having a diameter of on the order of 0.1–0.2 microns. Additional attempts have been made to rely upon photolithography or etching to establish an opening through the insulative layer. All of these methods suffer from technological constraints upon the hole size, and offer less than optimal repeatability.

Accordingly, the present invention provides a new method and apparatus for creating small electrodes, so as, for example, to establish minimally-sized active areas in a chalcogenide layer disposed adjacent to such insulative layer. In a preferred implementation of the invention, the active area of the chalcogenide element can be generally controlled through selection of the electrode size in the insulative layer.

SUMMARY OF THE INVENTION

The present invention comprises an electrode suitable for use in a multi-state memory cell for use in a memory array of a memory device. The electrode includes a base portion and an upper portion. The base portion includes a recessed plug of conductive material configured for electrically coupling to an access device or to an access line. The upper portion includes a cylindrically shaped spacer of an insulative material, the spacer having a center hole, and a contact plug of conductive material, the contact plug placed inside the center hole. The contact plug electrically couples to the base portion and is configured for coupling to a multi-state element.

The electrode can be manufactured by first providing a dielectric volume and then etching an opening within the dielectric volume. The recessed plug of conductive material is then formed within a lower portion of the opening, preferably by chemical vapor deposition (CVD). The spacer is formed, generally by deposition and anisotropic etching, along the sidewalls of an upper portion of the opening. Finally the contact plug is formed within the central hole, preferably by CVD.

DESCRIPTION OF PREFERRED EMBODIMENTS

Figure 1:
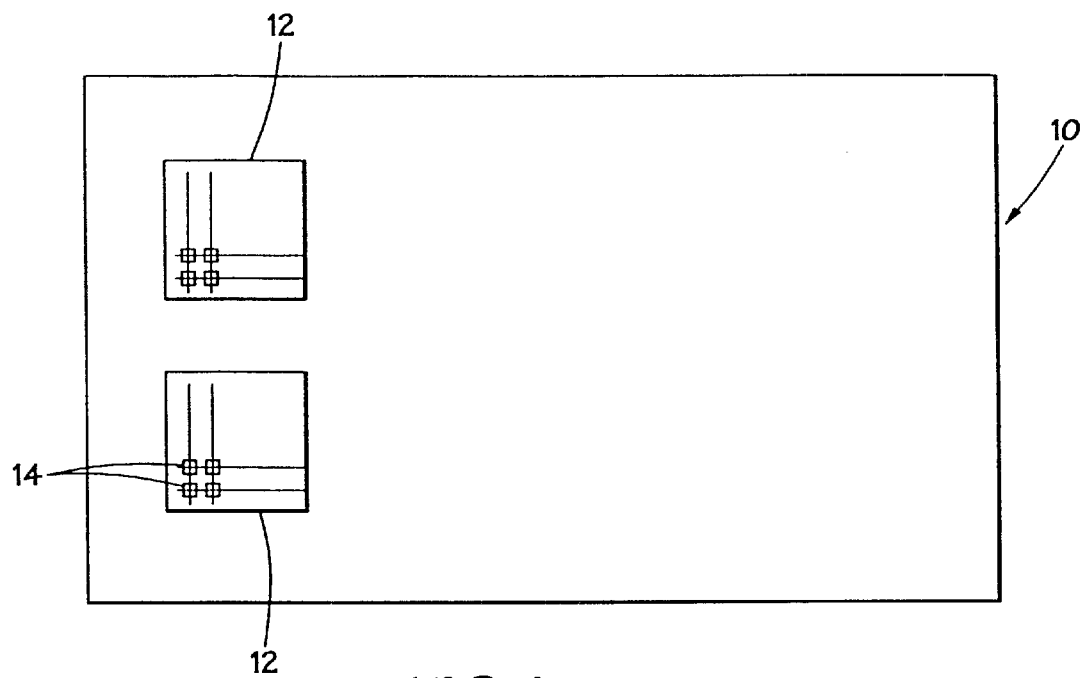
FIG. 1 is a top plan view of a memory device including a plurality of memory arrays.
Figure 2:
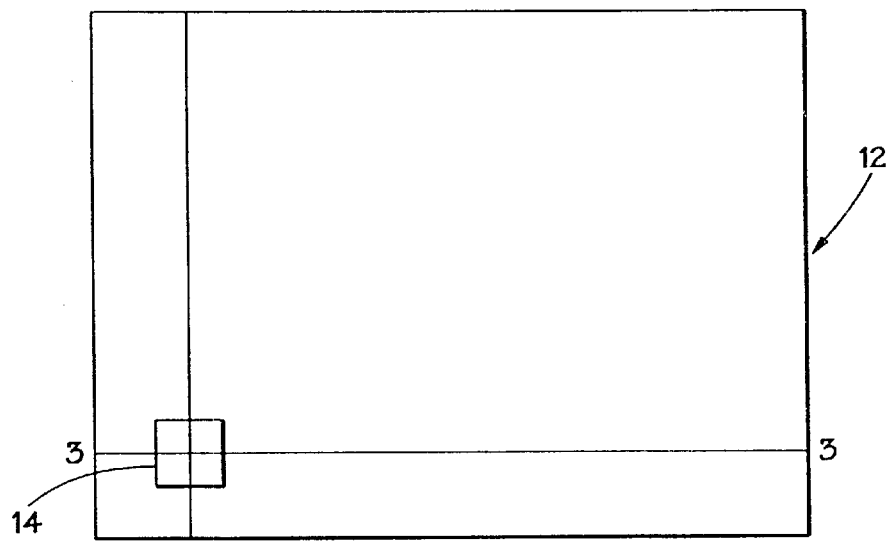
FIG. 2 is a top plan view of a portion of one of the memory arrays of FIG. 1, including a memory cell manufactured in accordance with the present invention.

Memory devices are integrated circuit (IC) devices that include built-in memory storage. A memory device 10 including a plurality of memory arrays 12 is illustrated in FIG. 1. As better seen in FIG. 2, each memory array 12 (also called a memory core) includes a plurality of memory cells 14 arranged to share connections in generally perpendicular rows (word lines) and columns (bit lines). Each memory cell 14 can be accessed for reading or writing by a corresponding access or isolation device, generally placed within a base layer (not shown), by selecting the corresponding row and column coordinates.

Figure 3:
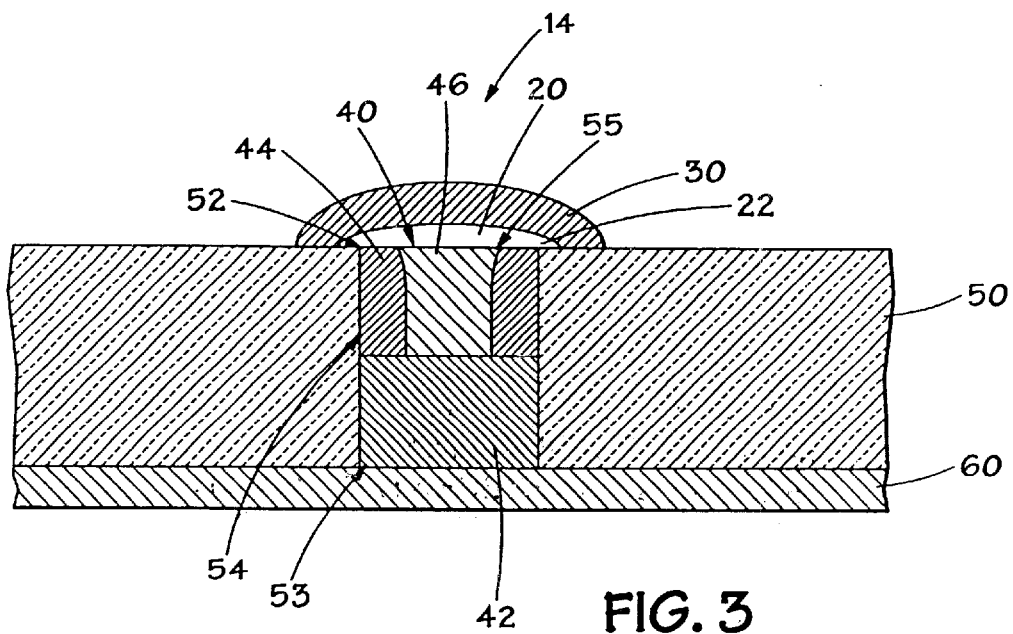
FIG. 3 is an elevation view of a cross-sectional cut along line 3—3 of the memory cell shown in FIG. 2, the memory cell having an electrode manufactured in accordance with the present invention

FIG. 3 illustrates a memory cell 14 of the memory array 12 of the memory device 10. Memory cell 14 includes a memory element 20, a conductive layer 30, and an electrode 40. The electrode 40 is placed within a dielectric volume 50, which in turn is placed over a conductive plate 60. In other embodiments, the conductive plate 60 can be replaced by an active device, such as an access diode or a portion thereof. A layer 22 of a selected memory-storage material is placed over the electrode 40. The area of the memory-storage material layer 22 proximally in contact with the electrode 40 becomes an active area, the non-volatile resistive memory element 20. The conductive layer 30 covers the memory-storage material layer 22.

In a preferred embodiment the memory-storage material layer 22 and the memory element 20 include multi-state materials, such as chalcogenide.

Suitable materials for the conductive layer 30 include tungsten, titanium nitride, carbon, and molybdenum. The conductive layer 30 can include a diffusion barrier and/or one or more conductive layers. The dielectric volume 50 includes boron and phosphorus doped silicone dioxide glass (BPSG) or an inter-layer dielectric (ILD) such as plasma enhanced chemical vapor deposited silicon dioxide. The conductive plate 60 can include, for example, polysilicon, single crystal silicon, and/or metal.

The electrode 40 rests within an opening 52 in the dielectric volume 50. The electrode 40 includes a base portion 42, located at a lower cavity portion 53 of opening 52 and in direct contact with the conductive plate 60, a cylindrically shaped spacer 44, located along the sidewalls of an upper cavity portion 54 of opening 52, and a contact portion 46, placed inside of a central hole 55 in the spacer 44. The opening 52 preferably has a depth-to-width ratio of at least 2:1.

In a preferred embodiment, both the base portion 42 and the contact portion 46 comprise tungsten or other materials that can be deposited using chemical vapor deposition (CVD). The spacer 44 may be formed, for example, of silicon dioxide or silicon nitride. The depth-to-width ratio of both the opening 52 and the contact electrode 46 is at least 2:1, and is preferably between 3:1 to 5:1. In one exemplary embodiment, the opening 52 has a depth of 1.2 to 1.5 micrometers and a width/diameter of 0.4 to 0.5 micrometer. The contact portion has a depth of 0.3 micrometer and a width/diameter of 0.1 micrometers or less.

Figure 4:
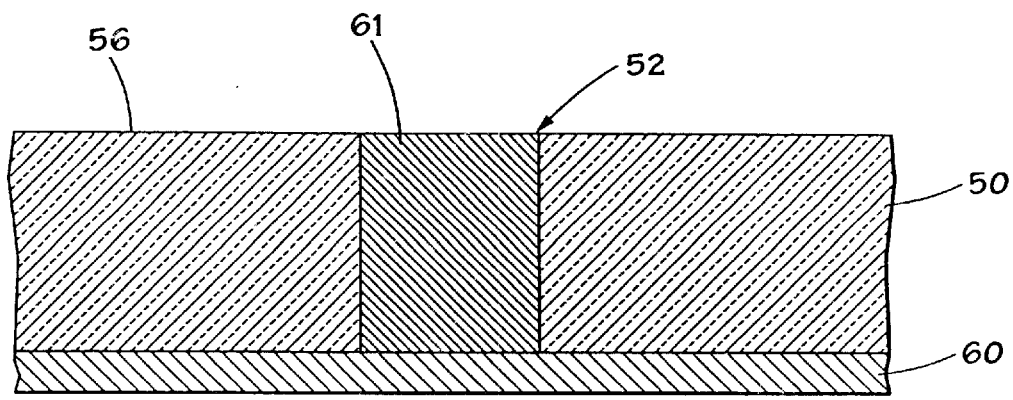
FIG. 4 is an elevation view of a cross-sectional cut of the electrode of FIG. 3 at an initial stage during the manufacturing process.

The electrode 40 of FIG. 3 is manufactured by a novel "plug-in-plug" process that allows the contact portion 46 of the electrode 40 to be much smaller than previous electrodes. To manufacture electrode 40, a plug opening 52 is first etched into the dielectric volume 50. The opening 52 is then filled with a plug 43 of a chemical vapor deposited conductive material. Any excess material above a top surface 56 of dielectric volume 50 is removed by a dry chemical etch, a mechanical planarization, a chemical-mechanical planarization (CMP), or other comparable methods selected in reference to the particular materials utilized to form electrode 40. FIG. 4 depicts the electrode 40 at the manufacturing stage after the plug 43 has been placed in opening 52 and planarized. The plug 43 is flush with top surface 56.

Next, the plug 43 is recessed below the top surface 56 to form the base portion 42 and to leave free the upper cavity portion 54 of opening 52. This can be accomplished by over-etching during the excess-material removal dry chemical etch, or by another, subsequent etch process. The spacer 44 can then be created by depositing and anisotropically etching an insulator/dielectric layer 43. This insulator/dielectric layer could be, for example, silicon oxide, silicon nitride or undoped silicon.

Figure 5:
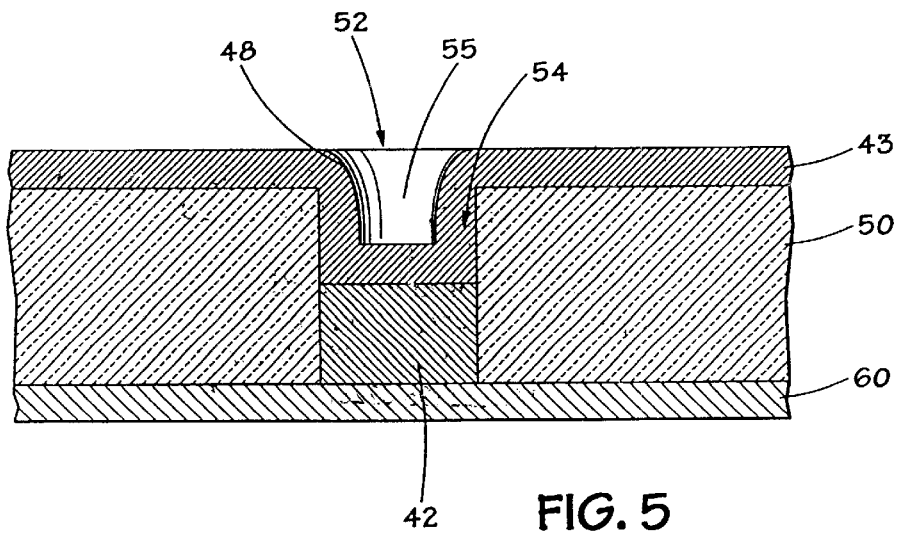
FIG. 5 is an elevation view of a cross-sectional cut of the electrode of FIG. 3 at an intermediate stage during the manufacturing process.
Figure 6:
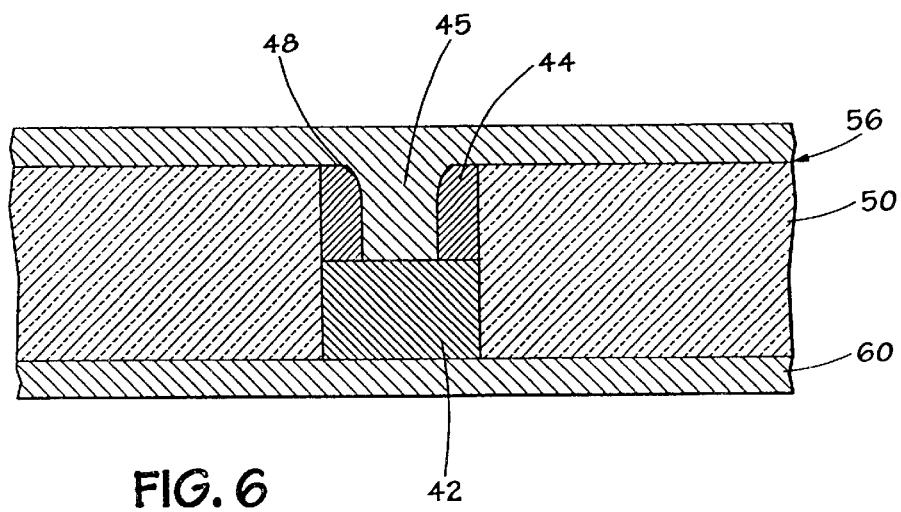
FIG. 6 is an elevation view of a cross-sectional cut of the electrode of FIG. 3 at a later intermediate stage during the manufacturing process.

FIG. 5 illustrates the step of manufacture of the electrode 40 after the insulator layer 43 has been deposited, but before it has been etched. The spacer 44 does not completely fill the upper cavity portion 54, leaving the central hole (or pore) 55 all the way down to the base portion 42. The spacer 44 may have a flare 48 as a result of practical limitations upon by the deposition and etching process. As will be appreciated by those skilled in the art, the dimensions of spacer 44 will be determined substantially by the thickness of insulator/dielectric layer 43 deposition and by the degree of anisotropy achieved in the etch process.

The contact electrode portion 46 is created by depositing a layer 45 over the dielectric volume and filling the central hole 55. This layer will typically be formed such as by using CVD or sputtering. In a particularly preferred implementation, layer 45 will be a memory-storage material, such as a chalcogenide. In such an implementation, the contact portion 46 can act as the memory element without the need for an additional layer of memory-storage material. Alternatively, layer 45 may simply be a conductive material, such as tungsten, carbon, etc., forming electrode 46.

Figure 7:
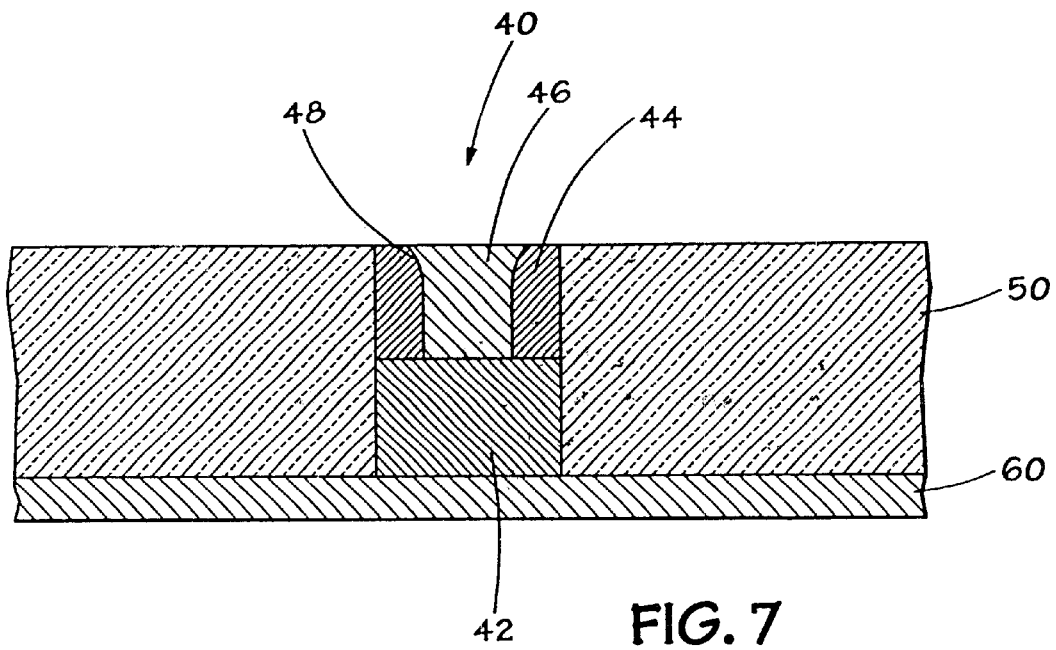
FIG. 7 is an elevation view of a cross-sectional cut of the completed electrode of FIG. 3.
Figure 8:
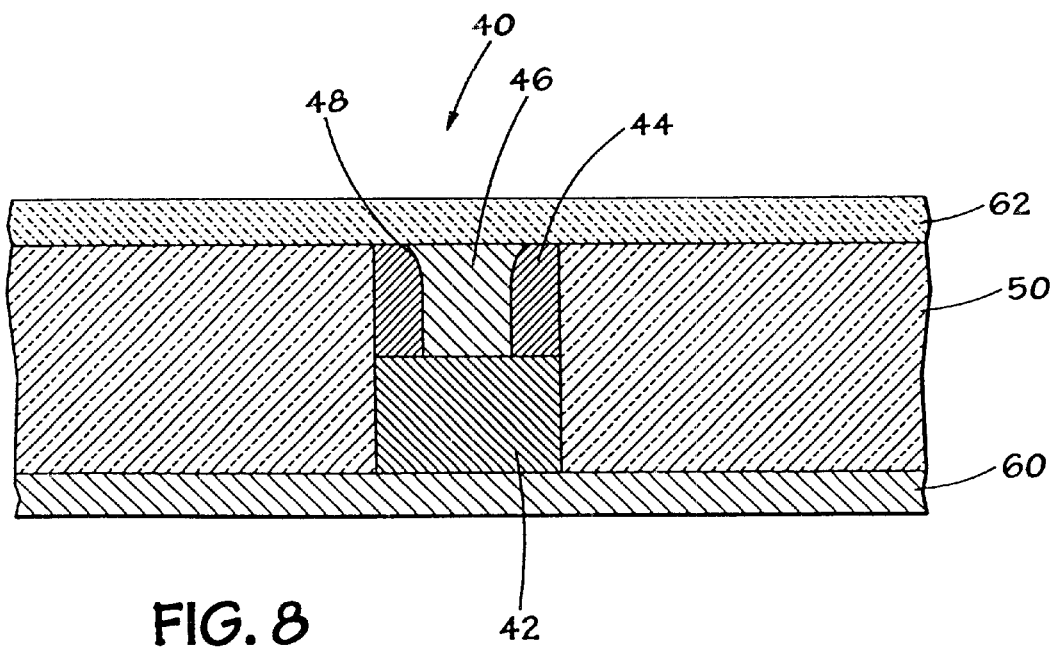
FIG. 8 is an elevation view of a cross-sectional cut of an alternative memory cell manufactured in accordance with the present invention.

Excess material forming layer 45 (i.e., that material above the top surface 56) is removed using a dry chemical etch, a mechanical planarization, a chemical-mechanical planarization (CMP), or other methods that accomplish similar results. FIG. 7 illustrates the finished electrode 40, the same as the one depicted in memory cell 14 of FIG. 3, after planarization. The contact portion 46 is significantly reduced in size from that of the original plug 43 shown in FIG. 4. As depicted in FIG. 8, another layer 62 may be formed above a plurality of electrodes 46. Where electrode 46 is formed of a chalcogenide element, layer 62 may be an electrode assembly (which may include a diffusion barrier layer to protect the chalcogenide). Alternatively, where electrode 46 is merely a conductive plug, layer 62 may be a chalcogenide layer accessible by electrode 46.

To further reduce the diameter of the contact electrode 46, the planarization can be done to a point below top surface 56 (either by removing a top portion of fill material 45 or by removing both a top portion of fill material 45 and of the dielectric volume 50) so as to remove the flare 48 of spacer 44, so as to establish minimum hole/pore size. The contact portion 46 is electrically coupled to the conductive plate 60 by the base portion 42.

Accordingly, it should be readily understood that the embodiment described and illustrated herein are illustrative only, and are not be considered as limitations upon the scope of the present invention. Other variations and modifications may be made in accordance with the spirit and scope of the present invention.

What is claimed is:

1. A memory device having at least one memory cell, said memory cell having a storage element comprising:

a first dielectric member having a first aperture therein, said first aperture having a first portion and a second portion;

a first conductive member disposed within said first portion of said first aperture;

a dielectric spacer formed within said second portion of said first aperture, said dielectric spacer defining a second aperture within said second portion of said first aperture;

a second conductive member disposed within said second aperture; and a layer of memory material disposed on said first dielectric member and on said second conductive member.

2. The memory device of claim 1, further comprising a third conductive member being electrically coupled to said memory material.

* * * * *